United States Patent
Suzuki et al.

(10) Patent No.: US 9,564,898 B2
(45) Date of Patent: Feb. 7, 2017

(54) POWER SWITCH RAMP RATE CONTROL USING SELECTABLE DAISY-CHAINED CONNECTION OF ENABLE TO POWER SWITCHES OR DAISY-CHAINED FLOPS PROVIDING ENABLES

(71) Applicant: Apple Inc., Cupertino, CA (US)

(72) Inventors: Shingo Suzuki, San Jose, CA (US); Harsha Krishnamurthy, San Jose, CA (US); Edvin Catovic, San Francisco, CA (US); Rajat Goel, Saratoga, CA (US); Manoj Gopalan, Milpitas, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/622,111

(22) Filed: Feb. 13, 2015

(65) Prior Publication Data
US 2016/0241240 A1 Aug. 18, 2016

(51) Int. Cl.
*H03K 19/003* (2006.01)
*H03K 19/00* (2006.01)

(52) U.S. Cl.
CPC .... *H03K 19/00361* (2013.01); *H03K 19/0013* (2013.01)

(58) Field of Classification Search
CPC ............ H03K 19/0016; H03K 19/0008; H03K 19/0013; H03K 19/00361; H03K 19/017581; H03K 17/164; H03K 23/50; H03K 23/54; G06F 1/3203; G06F 1/3287
See application file for complete search history.

(56) References Cited

U.S. PATENT DOCUMENTS

| | | |
|---|---|---|
| 6,980,042 B2 | 12/2005 | LaBerge |
| 7,046,052 B1 | 5/2006 | Percey et al. |
| 7,126,370 B2 | 10/2006 | Bhattacharya |
| 7,190,187 B2 | 3/2007 | Hua et al. |
| 7,304,512 B2 | 12/2007 | Duvillard et al. |
| 7,411,423 B2 | 8/2008 | Berthold et al. |
| 7,420,388 B2 | 9/2008 | Bhattacharya |
| 7,479,801 B2 | 1/2009 | Bhattacharya |

(Continued)

OTHER PUBLICATIONS

U.S. Appl. No. 12/879,772, filed Sep. 10, 2010.
J.B. Kuang, et al., "The Design and Implementation of a Low-Overhead Supply-Gated SRAM," IEEE, 2006, pp. 287-290.

*Primary Examiner* — Alexander H Taningco
*Assistant Examiner* — Seokjin Kim
(74) *Attorney, Agent, or Firm* — Meyertons, Hood, Kivlin, Kowert & Goetzel, P.C.; Lawrence J. Merkel

(57) ABSTRACT

In an embodiment, an integrated circuit may include one or more power gated blocks and a power manager circuit. The power manager circuit may be configured to generate a block enable for each power gated block and a block enable clock. The power gated block may generate local block enables to various power switch segments in the power gated block. In particular, the power gated block may include a set of series-connected flops that receive the block enable from the power manager circuit. The power gated block may include a set of multiplexors (muxes) that provide the local block enables for each power switch segment. One input of the muxes is coupled to the block enable, and the other input is coupled to another enable propagated through one of the other power switch segments. Accordingly, the muxes may be controlled to select the propagated enables or the input block enable.

19 Claims, 10 Drawing Sheets

(56) References Cited

U.S. PATENT DOCUMENTS

| | | | |
|---|---|---|---|
| 7,605,631 B2 | 10/2009 | LaBerge | |
| 7,659,746 B2 | 2/2010 | Chua-Eoan et al. | |
| 7,716,609 B1 | 5/2010 | Taheri | |
| 8,026,741 B2 | 9/2011 | Takayanagi | |
| 8,120,208 B2 | 2/2012 | Takayanagi et al. | |
| 8,327,163 B2 * | 12/2012 | Chen | G06F 1/26 713/300 |
| 8,362,805 B2 | 1/2013 | Suzuki et al. | |
| 8,421,499 B2 | 4/2013 | Takayanagi et al. | |
| 8,786,309 B2 | 7/2014 | Takayanagi et al. | |
| 8,872,539 B2 | 10/2014 | Oda | |
| 2004/0184289 A1 | 9/2004 | Vinciarelli | |
| 2005/0268130 A1 * | 12/2005 | Naruse | G06F 1/24 713/322 |
| 2006/0055391 A1 | 3/2006 | Kuang et al. | |
| 2006/0261855 A1 | 11/2006 | Hillman et al. | |
| 2008/0093632 A1 | 4/2008 | Sakurabayashi | |
| 2009/0066164 A1 | 3/2009 | Flynn et al. | |
| 2009/0160253 A1 | 6/2009 | Rao et al. | |
| 2009/0268531 A1 | 10/2009 | Nii et al. | |
| 2011/0198941 A1 * | 8/2011 | Suzuki | H03K 19/0016 307/116 |
| 2011/0198942 A1 * | 8/2011 | Takayanagi | H03K 19/0016 307/116 |
| 2012/0066530 A1 * | 3/2012 | Suzuki | G06F 1/3287 713/322 |
| 2015/0082070 A1 * | 3/2015 | Bose | G06F 1/3287 713/324 |

* cited by examiner

POWER SWITCH RAMP RATE CONTROL USING SELECTABLE DAISY-CHAINED CONNECTION OF ENABLE TO POWER SWITCHES OR DAISY-CHAINED FLOPS PROVIDING ENABLES

BACKGROUND

Technical Field

Disclosed embodiments are related to the field of integrated circuits, and more particularly to supplying power to circuitry in integrated circuits.

Description of the Related Art

As the number of transistors included on an integrated circuit "chip" continues to increase, power management in the integrated circuits continues to increase in importance. Power management can be critical to integrated circuits that are included in mobile devices such as personal digital assistants (PDAs), cell phones, smart phones, laptop computers, net top computers, etc. These mobile devices often rely on battery power, and reducing power consumption in the integrated circuits can increase the life of the battery. Additionally, reducing power consumption can reduce the heat generated by the integrated circuit, which can reduce cooling requirements in the device that includes the integrated circuit (whether or not it is relying on battery power).

Clock gating is often used to reduce dynamic power consumption in an integrated circuit, disabling the clock to idle circuitry and thus preventing switching in the idle circuitry. While clock gating is effective at reducing the dynamic power consumption, the circuitry is still powered on. Leakage currents in the idle transistors lead to static power consumption. The faster transistors (those that react to input signal changes, e.g. on the gate terminals) also tend to have the higher leakage currents, which often results in high total leakage currents in the integrated circuit, especially in high performance devices.

To counteract the effects of leakage current, some integrated circuits have implemented power gating. With power gating, the power to ground path of the idle circuitry is interrupted, reducing the leakage current to near zero. There can still be a small amount of leakage current through the switches used to interrupt the power, but it is substantially less than the leakage of the idle circuitry as a whole.

Power gating presents challenges to the integrated circuit design. As blocks are powered up and powered down, the change in current flow to the blocks can create noise on the power supply connections. The noise can affect the operation of the integrated circuit, including causing erroneous operation. Additionally, the rate of change in the current flow (di/dt) varies with process variations in the semiconductor fabrication process, and can also vary with the magnitude of the supply voltage supplied to the integrated circuit and with the operating temperature of the integrated circuit. When these factors slow the rate of change of the current, the delay to enable a power gated block increases. Accordingly, balancing the delay to enable the power gated blocks and the power supply noise is challenging.

A possible solution to balancing the delay and noise is described in U.S. Pat. No. 8,362,805 ("the '805 patent"). The '805 patent describes connecting a serial chain of flops to the enable. The output of each flop in the chain is connected to a set of power switches. Accordingly, the switches are serialized to control the ramp rate to an acceptable level. As also described in the '805 patent, the delay may also be fixed based on the clock frequency of the clock to the flops. Initial power up of an integrated circuit employing an approach described in the '805 patent may include ensuring that control for the flops is ready prior to powering up the power-gated blocks. Another possible solution is presented in U.S. Pat. No. 8,421,499 ("the '499 patent"). The '499 patent describes connecting sets of power switches with enable control circuits. Each enable control circuit may also be connected to the global block enable. If the power, voltage, and temperature (PVT) conditions indicate a slow ramp rate, the enable control circuits may select the global enable such that the power switches power up in parallel. If the PVT conditions indicate a fast ramp rate, the enable control circuits may select the power switch enable propagated from the previous set of power switches, connecting the sets of power switches in series. The '499 patent describes that the integrated circuit may include information about the manufacturing process at the time of fabrication, along with voltage magnitude information and temperature measurements. The sets of power switches may then be designed such that the fastest PVT conditions will not violate di/dt limits of the integrated circuit and such that parallel connection of the sets does not violate di/dt limits in slower PVT conditions.

SUMMARY

In an embodiment, an integrated circuit may include one or more power gated blocks and a power manager circuit. The power manager circuit may be configured to generate a block enable for each power gated block and a block enable clock. The power gated block may generate local block enables to various power switch segments in the power gated block. In particular, the power gated block may include a set of series-connected flops that receive the block enable from the power manager circuit. The power gated block may include a set of multiplexors (muxes) that provide the local block enables for each power switch segment. One input of the muxes is coupled to the block enable, and the other input is coupled to another enable propagated through one of the other power switch segments. Accordingly, the muxes may be controlled to select the propagated enables (creating a serial connection of the power switch segments) or the input block enable (staggering the local enables according to the block enable clock).

In an embodiment, the muxes may default to selecting the propagated enables from the power switch segments. The control logic for the flops (e.g. the power manager circuit and/or local control circuitry) need not be initialized prior to power up; and the power gated block may be powered up at the same time as other circuitry. During power up of the integrated circuit, di/dt limits and power up latency of the power gated blocks may not be as significant since the integrated circuit as a whole is being powered up. During later power up of the power gated block (while other circuitry in the integrated circuit is already in operation), the latency and/or di/dt noise on the power supply may be more significant. In an embodiment, the control circuitry for the flops and mux selects may be included in a block that remains powered when the power gated block is powered down. Thus, the control circuitry may remain initialized and ready to control the power up when the power gated block is subsequently powered. If wakeup latency is not a concern but di/dt noise is a concern for a given power gated block, the muxes may select the propagated enables. Wakeup latency may be longer than if the flops are selected, but the di/dt noise may be lower than some embodiments of the flops. The flopped enable may be selected if both wakeup latency and di/dt noise are concerns, enabling power switch segments in parallel. The latency of the power up may be reduced, and the di/dt noise may be controlled through the frequency of the clock to the flops. In an embodiment, the frequency of the clock may be varied during power up to further control the di/dt noise and to further reduce latency.

BRIEF DESCRIPTION OF THE DRAWINGS

The following detailed description makes reference to the accompanying drawings, which are now briefly described.

Figure 1:
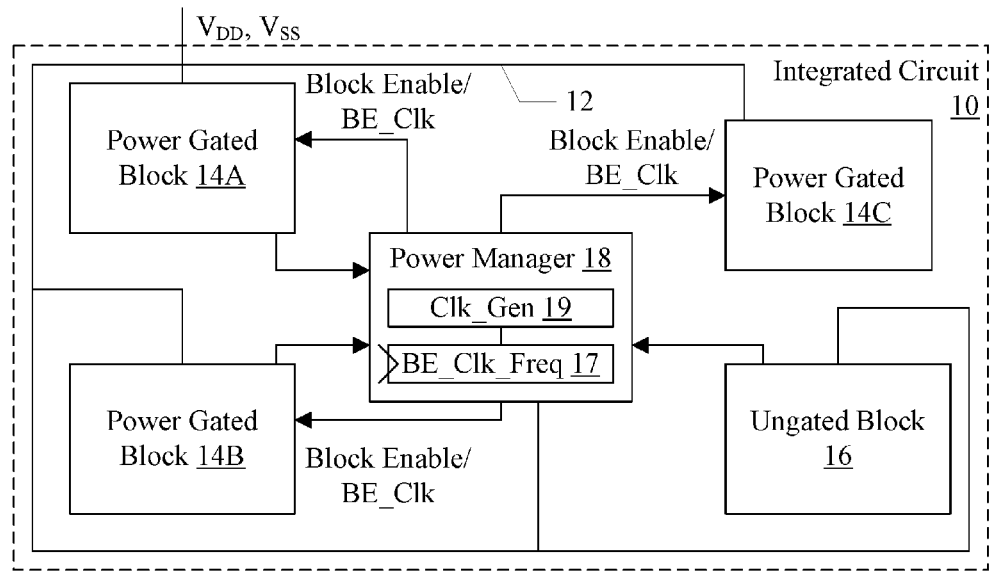
FIG. 1 is a block diagram of one embodiment of an integrated circuit.

While the embodiments described herein are susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112(f) interpretation for that unit/circuit/component.

DETAILED DESCRIPTION OF EMBODIMENTS

Turning now to FIG. 1, a block diagram of one embodiment of an integrated circuit 10 is shown. The integrated circuit 10 is coupled to receive power supply inputs (e.g. $V_{DD}$ and $V_{SS}$, or power and ground, respectively). The $V_{DD}$ voltage may have a specified magnitude measured with respect to ground/$V_{SS}$ during use. More particularly, the $V_{DD}$ voltage may have a number of magnitudes that may be used for different operating points of the integrated circuit 10 during use. The integrated circuit 10 may include an interconnect, e.g. a global power supply grid, for each supply voltage, to distribute the voltage over an area occupied by the integrated circuit 10 (e.g., an area at the surface of a semiconductor substrate such as silicon). The global power supply grids are illustrated in FIG. 1 as the line 12 coupled to the blocks 14A-14C, 16, and 18 in FIG. 1. However, the grids may physically be arranged in a somewhat regular fashion, as described in more detail below.

The integrated circuit 10 may include one or more power gated circuit blocks such as blocks 14A-14C. Each block 14A-14C may include circuitry such as transistors that are arranged to implement the desired operations of the integrated circuit 10, and thus may be circuit blocks (although sometimes referred to herein as simply "blocks" for brevity). For example, the blocks 14A-14C may be processors or portions thereof (e.g. execution units within the processors); interface circuitry; peripheral circuitry such as graphics processing circuitry; user interface circuitry; multimedia circuitry such as audio and/or video processing circuitry; etc.

Generally, a circuit block may include a set of related circuits that implement one or more identifiable operations. The related circuits may be referred to as logic circuits or logic circuitry, since the circuits may implement logic operations on inputs to generate outputs. Because the circuits in a given circuit block are related, they may be powered up or powered down as a unit. Each circuit block may generally be treated as a unit during the design of the integrated circuit (e.g. being physically placed within the integrated circuit as a unit). The circuit block may further include memory circuitry (e.g. various static random access memories, or SRAMs) and other storage devices that are part of the logic circuitry.

A power gated circuit block (or simply a power gated block) may be a circuit block that may have at least one of its power supply voltages ($V_{DD}$ or $V_{SS}$) interrupted in response to deassertion of a block enable input signal. The power gated blocks may include power switches that are coupled to the global power supply grid and to a local power supply grid. If the enable is asserted, the power switches may electrically connect the global and local power supply grids. If the enable is deasserted, the power switches may electrically isolate the global and local power supply grids. When electrically connecting the grids, the power switch may be referred to as being on, and when electrically isolating the grids, the power switch may be referred to as being off. The voltage on the global power supply grid may appear on the local supply grid when electrically connected. However, the switches may have some impedance, and thus the voltage on the local power supply grid may differ from the voltage on the global power supply grid. The local supply voltage may be referred to as "virtual" (e.g. virtual $V_{DD}$ or virtual $V_{SS}$).

When a power gated block 14A-14C is enabled, the power switches turn on and current flows to charge the local power supply grid in the power gated block 14A-14C. In order to reduce the rate of change of current (di/dt) on the global power supply grids, which may generate enough noise to cause erroneous behavior in other circuitry in some cases, the power gated block 14A-14C may control the turn on of the power switches. Particularly, in the illustrated embodiment, the power gated blocks 14A-14C may receive a clock signal (BE_Clk in FIG. 1) in addition to the block enable. The power gated block 14A-14C may enable a different subset of the power switches in each clock cycle of the BE_Clk, thus reducing the rate of change of the current as compared to concurrently enabling the entire set of power switches. By controlling the frequency of the BE_Clk, the rate of change of the current may be controlled to acceptable levels, in some embodiments. More particularly, the power gated block 14A-14C may include a series-coupled set of flops or other clocked storage devices that are controlled by the BE_Clk. Each flop may be coupled to a respective subset of the power switches and may provide an enable to the subset responsive to the block enable and the BE_Clk from the power manager 18.

The power gated blocks 14A-14C may be configured to generate a given enable for a given subset of power switches by selecting between an output of one of the flops and a propagated block enable that has passed through another subset of the power switches. If the propagated block enable is selected for each subset, the subsets are coupled in series. In an embodiment, the default may be to select the propagated block enable. Thus, when the integrated circuit 10 is powered up as a whole (and thus is resetting, including the power manager 18), the power gated blocks 14A-14C may power up in parallel with other circuitry and the control for the block enables and block enable clocks need not be initialized prior to powering the power gated blocks 14A-14B.

In the illustrated embodiment, the power manager 18 may include a clock generator circuit 19 that generates the BE_Clk clock. The frequency of the clock may be programmable (e.g. via software executing on a processor within the IC 10 or coupled to the IC 10) via the BE_Clk_Freq register 17 coupled to the clock generator circuit 19. The clock generator circuit 19 may be any type of clock generator (e.g. a phase locked loop, a clock divider receiving an input clock and dividing it in frequency, a clock multiplier, etc.). In an embodiment, described in more detail below, the local control circuitry in the power gated blocks 14A-14C that controls the power switch enables may vary the frequency of the block enable clock used to actually clock the block enable flops, based on the BE_Clk. For example, a set of divisors may programmed into the power gated blocks 14A-14C that may control the frequency variation. The divisor that is used initially may generally be the largest divisor, and the divisors may reduce in size as the enables progress. That is, the clock frequency may be monotonically increasing from the beginning of clocking the block enable into the flops until the block enable has fully propagated to the power switches within the block.

A power manager 18 is coupled to the blocks 14A-14C and 16, and may be configured to monitor the activity in the blocks 14A-14C and 16 to generate the block enables for the power gated blocks 14A-14C. The activity in one block may be an indicator that another block is about to become active and should be powered up. For example, the blocks 14A-14C and 16 may be part of a pipeline. If one pipeline stage is active, it may be likely that the next stage will be active soon. Similarly, in a processor, a fetch request may indicate that instructions will be fetched and decoded soon, and thus the execution units may be powered up. Power gated blocks may be components of a system on a chip, and a communication from one component to another may indicate that a block may need to be powered up. Activity in a block may also indicate that the block or another block is about to be idle and may be powered down. While the ungated block may not be enabled or disabled for power gating, its activity may be useful in determining if the power gated blocks may be disabled. In some embodiments, clock gating may be implemented in addition to power gating. In such embodiments, the power manager 18 may also implement the clock gating, or the clock gating may be implemented separately. While the power manager is shown as a block in FIG. 1, the power manager 18 may actually be distributed as desired.

Generally, the power manager 18 may be configured to deassert the block enable to power down a block, and to assert the block enable to power up a block. The block enable (and other signals described herein) may be asserted at one logical state and deasserted at the other logical state. For example, the signal may be asserted (indicating enable) at a low logical state (binary zero) and deasserted at a high logical state (binary one). The signal may alternatively be deasserted at the low logical state and asserted at the high logical state. Different signals may have different asserted/deasserted definitions. In some contexts, a signal may be referred to as asserted low, or alternatively asserted high, for additional clarity.

In various embodiments, a period of time may elapse after a power gated block 14A-14C has its block enable deasserted before the supply voltage has drained, and there may be a period of time after assertion of the enable before the power gated block is considered stable and ready for use. The power manager 18 may be configured to account for these times when determining if the block enable may be deasserted, and in determining when to reassert the block enable for the next power up of the block.

The electrical isolation of the local and global power supply grids that may be provided by the power switches may generally refer to a lack of active current flow between the grids. The power switches themselves may have leakage current, so there may be some leakage current flow. Similarly, the electrical connection of the local and global power supply grids may refer to an active current flow between the grids to provide the voltage from the global grid to the local grid. Viewed in another way, electrically connected grids may have a very low impedance path between them, whereas electrically isolated grids may have a very high impedance path. Viewed in still another way, electrically connected grids may be actively passing a voltage from one grid to the other, wherein electrically isolated grids may be preventing the passing of the voltage.

The local and global power supply grids may generally distribute a power supply voltage over various areas of the integrated circuit 10. The global power supply grids distribute the voltage over the entire area of the integrated circuit 10, while local power supply grids distribute power supply voltages within a power gated block. The ungated blocks may also include local power supply grids, but since they do not include power switches, the local power supply grids may essentially be part of the global power supply grid. In general, the power supply grids may have any configuration. For example, in one embodiment, a given block may have power supply connections to the underlying circuitry at certain physical locations (e.g. regularly spaced channels over the area). The power supply grids may include wiring running above these regularly spaced channels. There may also be wires running in the orthogonal direction to the wiring, to reduce impedance and to supply current to any localized current "hot spots". Other grids may include any sort of distribution interconnect and/or there may be irregularities in the grids, or the interconnect may essentially be a plane of metal. In one embodiment, the global power supply grids may be provided in one or more of the highest layers of metal (wiring layers), i.e. those layers that are farthest from the surface of the semiconductor substrate. The local power supply grids may be included in lower layers of metal. Connections between the power supply grids may be made to the power switches at a surface of the semiconductor substrate. The metal may be any conductive material used for interconnect in the semiconductor fabrication process used to fabricate the integrated circuit 10. For example, the metal may be copper, aluminum, tungsten, combinations thereof (e.g. aluminum or copper wiring layers and tungsten vias), alloys thereof, etc.

The power supply voltages ($V_{DD}$ and $V_{SS}$) may generally be externally supplied to the integrated circuit, and may be generally intended to be relatively static during use. While the magnitude of the supply voltages may be intentionally changed during use (e.g. for power management), the magnitude changes are not intended to be interpreted by receiving circuits in the fashion that dynamically varying signals are interpreted. Similarly, local variations in the power supply voltages may occur (such as $V_{DD}$ droop or $V_{SS}$ bounce) during operation, but these variations may generally be undesirable transients. The power supply voltages may serve as sources and sinks of current as the circuitry evaluates.

As mentioned above, the power gated blocks 14A-14C may have their power gated, e.g. when inactive, to reduce power consumption in the integrated circuit. According, the power gated blocks 14A-14C are each coupled to receive an enable signal (block enable in FIG. 1). The block enable signal for each block may be a separate, unique signal for that block, so that the power gated blocks 14A-14C may be individually enabled or not enabled. In some cases, one or more power gated blocks may share an enable. A shared block enable may be physically the same signal, or logically the same signal (i.e. the signals are physically separate by logically operated the same way). The integrated circuit 10 may also include one or more ungated circuit blocks such as ungated block 16. Ungated blocks may be coupled to the power supply grids 12 without any power switches, and thus may be powered up whenever the integrated circuit 10 is powered up. Ungated blocks may be blocks that are active most or all of the time, so that including the power switches and attempting to power gate them is not expected to produce much power savings, if any, for example.

It is noted that, while one ungated block and three power gated blocks are shown in FIG. 1, there may generally be any number of one or more power gated blocks and ungated blocks, in various embodiments. Similarly, there may be more than one power manager 18 in the integrated circuit 10 (e.g. enabling/disabling various non-overlapping subsets of the power gated blocks).

It is noted that one or more circuit blocks may include state storage (e.g. memory, flops, registers). It may be desirable to retain the state in the state storage (or some of the state storage). In such cases, the global power grids may supply power to the state storage without power switches in the power to ground path. A separate local power grid may be provided, for example, without power switches.

Figure 2:
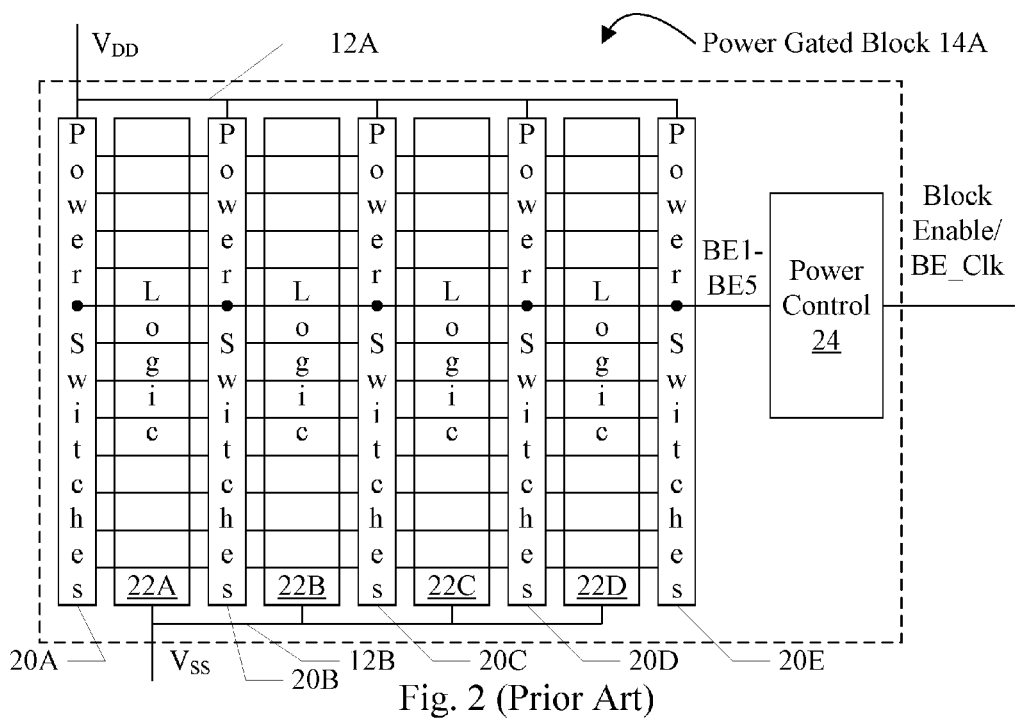
FIG. 2 is a block diagram of one embodiment of a power gated block shown in FIG. 1.

Turning now to FIG. 2, a block diagram of one embodiment of the power gated block 14A is shown. Other power gated blocks 14B-14C may be similar. In the embodiment of FIG. 2, the power gated block 14A includes multiple power switches located at a variety of physical locations within the power gated block 14A, as illustrated. That is, the power switches may be physically distributed over the area occupied by the power gated block 14A. In this embodiment, the power switches are placed at regularly spaced intervals, although other distributions that are not regular may be used in other embodiments. Each location may include multiple power switches (e.g. power switch segment 20A may include multiple power switches). The power switches at one location may be referred to as a segment of power switches 20A-20E. The power gated block 14A further includes a power control circuit 24. The power control circuit 24 is illustrated as a block in FIG. 2, but may be physically distributed near the locations of the power switch segments in some embodiments. The block enable and BE_Clk for the power gated block 14A are coupled to the power control circuit 24. The power control circuit 24 is coupled to each of the power switch segments 20A-20E, supplying each segment with a respective local block enable (BE1 to BE5 in FIG. 2).

In this embodiment, the power switches are coupled between the global $V_{DD}$ grid 12A and the local $V_{DD}$ grid of the power gated block 14A. The local $V_{DD}$ grid is illustrated as the horizontal lines in FIG. 2 between the power switch segments 20A-20E. Between each of the power switch segments 20A-20E, logic circuits 22A-22D are provided. The logic circuits 22A-22D may be powered by the local $V_{DD}$ grid, and also by the local $V_{SS}$ grid which is not shown in FIG. 2. The global $V_{SS}$ grid 12B is shown coupled to each of the logic circuits 22A-22E, but there may generally be a local $V_{SS}$ grid to which the global $V_{SS}$ grid 12B is coupled. While FIG. 2 shows the power switch segments 20A and 20E at the edges of the power gated block 14A with no circuitry between the edges of the power gated block 14A and the power switch segments 20A and 20E, these power switch segments may not necessarily be placed at the edges. In other words, logic circuits may be placed to the left of the power switch segment 20A in FIG. 2 and/or to the right of power switch segment 20E in FIG. 2.

The power control circuit 24 may generate the local block enables BE1-BE5 for the segments responsive to the block enable and BE_Clk from the power manager 18. Additional details are discussed further below.

The power switches may generally comprise any circuitry that may electrically connect a local power supply grid to a global power supply grid in response to an asserted enable signal and may electrically isolate the local power supply grid from the global power supply grid in response to a deasserted enable signal. For example, each power switch may be a P-type Metal-Oxide-Semiconductor (PMOS) transistor for embodiments that implement power switches on the $V_{DD}$ power supply grid. The gate of the PMOS transistor may be coupled to receive the (possibly buffered) local block enable signal (BE1-BE5 in FIG. 2), a source coupled to the global $V_{DD}$ grid 12A, and a drain coupled to one or more local $V_{DD}$ grid lines. Accordingly, the block enable signal may be asserted low in this example, turning the PMOS transistor 24 on and actively conducting current from the global $V_{DD}$ grid 12A to the local $V_{DD}$ grid lines. Embodiments which implement the power switches on the $V_{SS}$ grid may be similar, except that the transistor may be an N-type MOS (NMOS) transistor and the block enable may be asserted high/deasserted low in such embodiments.

Figure 3:
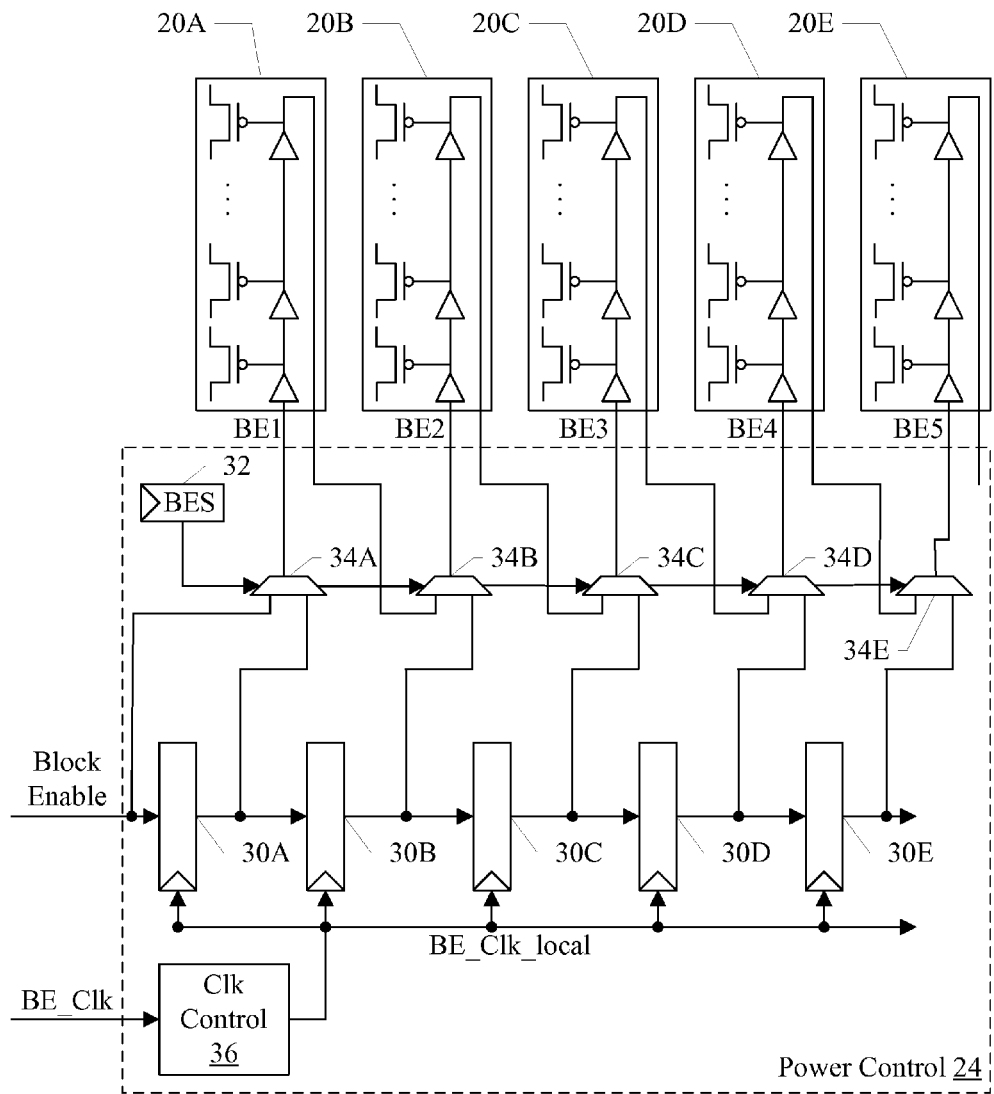
FIG. 3 is a block diagram illustrating one embodiment of a power control circuit and one embodiment of power switches for a power gated block shown in FIG. 2.

Turning next to FIG. 3, a block diagram illustrating one embodiment of the power control circuit 24 and the power switch segments 20A-20E in greater detail is shown. In the illustrated embodiment, the power control circuit 24 includes a set of clocked storage devices 30A-30E, a set of muxes 34A-34E, a block enable select circuit 32, and a clock control circuit 36.

A clocked storage device may be any device that is configured to capture input data responsive to a clock signal and to store that data in a stable state until the next capture of data. Clocked storage devices may include flops, registers, latches, etc. Flops will be used as an example for the rest of this description, but in general any clocked storage devices may be used in other embodiments.

The flops 30A-30E are serially-connected to each other. That is, the output of each flop 30A-30E is connected as the input to another flop 30A-30E. For timing purposes, the output of each flop 30A-30E may be buffered and the output of the buffers may be the input to the next flop 30A-30E in the serial connection. In general, any connection that provides a logically equivalent signal output from one of the flops 30A-30E to another one of the flops 30A-30E may be a serial connection of the flops 30A-30E. The connection of the flops may also be referred to as a daisy chain. Specifically, in the illustrated embodiment, the flop 30A is coupled to receive the block enable from the power manager 18; the flop 30B is coupled to receive the output of the flop 30A; the flop 30C is coupled to receive the output of the flop 30B; the flop 30D is coupled to receive the output of the flop 30C; the flop 30E is coupled to receive the output of the flop 30D; etc.

The flops 30A-30E may be clocked by a BE_Clk_local that is generated by the clock control circuit 36. That is, the clock control circuit 36 is coupled to the clock inputs of the flops 30A-30E. The clock control circuit 36 is also coupled to the BE_Clk input from the power control 24. The clock control circuit 36 may be configured to generate the BE_Clk_local from the BE_Clk, but may vary the frequency of the BE_Clk_local as the enable of the power gated block 14A progresses. Most of the current flowing into the local $V_{DD}$ power grid through the power switches may occur early in the power up. Accordingly, by powering up power switch segments at lower clock frequencies initially, the current may be controlled as the local power grid powers up. As the local power grid's voltage magnitude nears the global supply voltage magnitude, the amount of current flow decreases and more power switches may be turned on. To reduce latency, the clock frequency may be increased through one or more intermediate frequencies. In an embodiment, the BE_Clk_local may reach the BE_Clk frequency by the time the enable is shifted through the flop chain. In an embodiment, the divisor for each phase may be programmable.

The current flow may not be an issue when the power gated block 14A is being powered down. Accordingly, the BE_Clk_local may operated at the BE_Clk frequency for power down events (when a deasserted block enable is being propagated through the flops 30A-30E).

The output of each flop 30A-30E is an input to a corresponding mux 34A-34E. That is, the output of the flop 30A is an input to the mux 34A; the output of the flop 30B is an input to the mux 34B; the output of the flop 30C is an input to the mux 34C; the output of the flop 30D is an input to the mux 34D; and the output of the flop 30E is an input to the mux 34E. The other input to the mux 34A is the input block enable from the power manager circuit 18. The other input for each mux 34B-34E may be the block enable propagated through the preceding power switch segment 20A-20D. That is, the other input of the mux 34B is the propagated block enable from the power switch segment 20A; the other input of the mux 34C is the propagated block enable from the power switch segment 20B; the other input of the mux 34D is the propagated block enable from the power switch segment 20C; and the other input of the mux 34E is the propagated block enable from the power switch segment 20D. The block enable select (BES) circuit 32 may generate the selection control for each mux 34A-34E, and the output of each mux 34A-34E may be one of the local block enables BE1 to BE5, as illustrated in FIG. 3. Again, the outputs may be buffered if desired to produce the local block enables. The BES circuit 32 may default to selecting the input block enable/propagated block enables. Subsequently, the BES circuit 32 may be programmed to select the outputs of the flops 30A-30E. In one embodiment, the BES circuit 32 may be flop that powers up to a logical state that selects the propagated enables (e.g. a logical zero). In that state, the power segments 20A-20E are connected in series. The BES may be programmed to the opposite state (e.g. a logical one) to select the outputs of the flops 30A-30E. In other embodiments, the BES circuit 32 may be a multi-bit programmable field that permits different muxes 34A-34E to select either a flop output or a propagated enable. The BES circuit 32 may be a field including a bit for each mux 34A-34E, allowing individual mux control.

As illustrated in FIG. 3, the power switch segments 20A-20E may include buffering as well, in addition to the power switches (e.g., the PMOS transistors shown in FIG. 3). Any number of buffers and any number of power switches may be included in a given segment, and different segments may include different numbers of buffers and/or power switches. Each buffer may drive more than one power switch.

Together, the buffers and the load of the power switches in each power switch segment 20A-20E may cause a delay in the propagation of the block enable signal through the power switch segment 20A-20E. The power switch segments may be designed so that the propagation delay, in best case PVT conditions, presents a di/dt that is less than or equal to an acceptable di/dt for powering up the power gated block. Best case PVT may generally refer to the conditions that cause the circuitry response to be faster than the other combinations of conditions. That is, the best case process parameters may be parameters that produce circuits that respond the most rapidly. The best case voltage may be the highest supply voltage magnitude that is supported by the integrated circuit 10. The best case temperature may be the lowest temperature supported by the integrated circuit, in some embodiments. In other embodiments, the best case temperature may be a different temperature. Similarly, worst case PVT conditions may be the conditions that cause the circuitry to respond slower than other combinations. Thus, the worst case process parameters may produce circuits that respond slowly. The worst case voltage may be the lowest support voltage magnitude, and the worst case temperature may be the highest supported temperature. Thus, the propagated enable from one of the power switch segments 20A-20E may be a delayed version of the input enable to the power switch segment 20A-20E.

Figure 4:
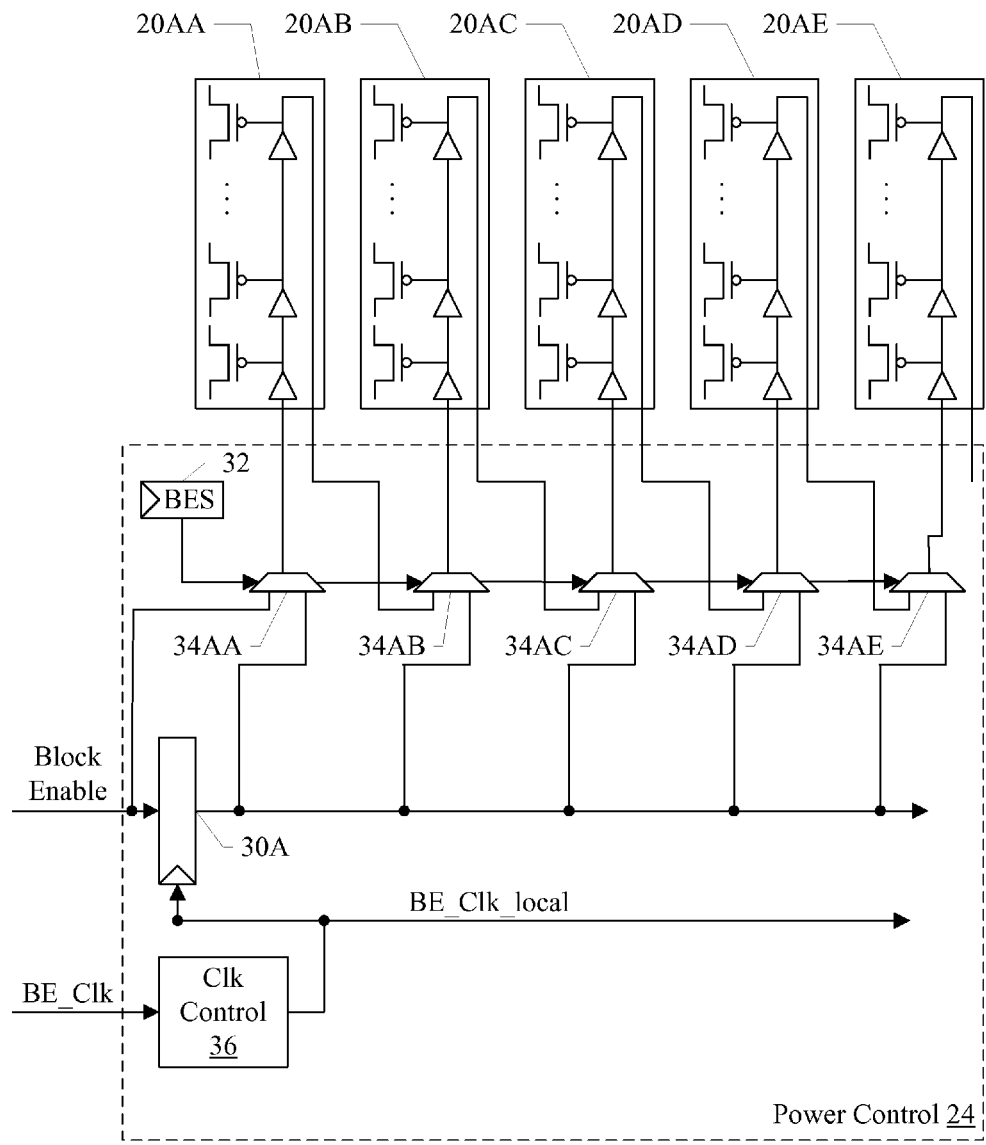
FIG. 4 is a block diagram illustrating another embodiment of a power control circuit and one embodiment of power switches for a power gated block shown in FIG. 2.

FIG. 4 is a block diagram of one embodiment of a portion of the power control circuit 24 and the power switch segment 20A. In the embodiment of FIG. 4, the power switch segment 20A includes multiple segments 20AA-20AE. The segments 20AA-20AE may be coupled in a daisy chain, or in parallel to receive the enable from the flop 30A.

Accordingly, multiple segments 20AA-20AE may be controlled by the same flop 30A, or they may be connected in series, through the muxes 34AA-34AE. Other flops such as flops 30B-30E may similarly control multiple power switch segments. A multiple bit BES field may be used to control combinations of serially connected and parallel power switch segments.

Figure 5:
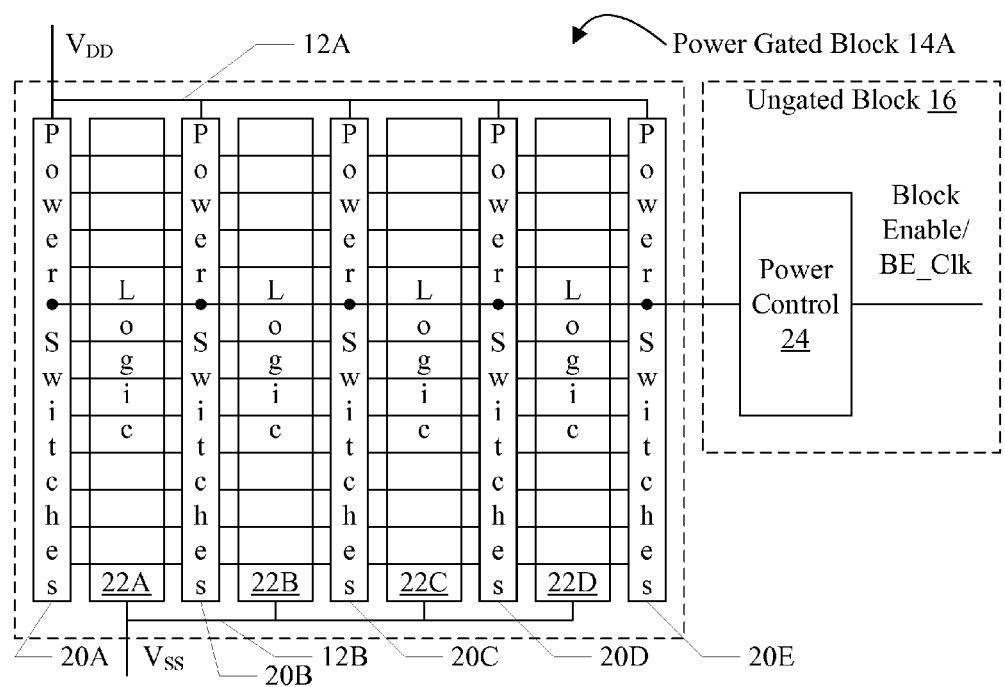
FIG. 5 is a block diagram illustrating an embodiment of a power gated block and an ungated block, including a power control circuit for the power gated block in the ungated block.

As mentioned previously, the power control circuit 24 may be initialized prior to controlling the power switch segments 20A-20E using the flops 30A-30E. So that the initialization is retained and the power control circuit 24 is available when the power gated block 12A is to be powered up, the power control circuit 24 (or a portion thereof) may be included in a block that remains powered when the power gated block 12A is powered down. FIG. 5 is a block diagram of an embodiment in which the ungated block 16 includes the power control circuit 24 (or a portion thereof). The ungated block 16 may be a nearest block to the power gated block 14A on the integrated circuit 10 that is powered on when the power gated block 14A is powered off. In an embodiment, the power control circuit 24 may be included in the ungated block 16. In another embodiment, the muxes 34A-34E may be in the ungated block 16 and other portions may be in the power gated block 14A. In still another embodiment, the flops 30A-30E may be in the ungated block 16 along with the muxes 34A-34E. It is noted that the muxes 34A-34E may be physically located within the power gated block 14A (e.g., near the power switch segments 20E-20E) but may be powered by an ungated power supply such as the power supply to the ungated block 16. Accordingly, FIG. 5 may be a representation of logical domains rather than a representation of physical location.

While the ungated block 16 is used in the embodiment of FIG. 5, a power gated block may be used for the power control circuit 24 as long as the power gated block remains powered or is powered up prior to the power gated block 14A. For example, the power gated block 14A may be an execution unit in a processor, and may be powered down until an instruction is fetched that uses the execution unit. The fetch and issue circuitry may be a power gated block that would be powered off in the entire processor is powered off, but may be powered on when the processor is powered on.

Figure 6:
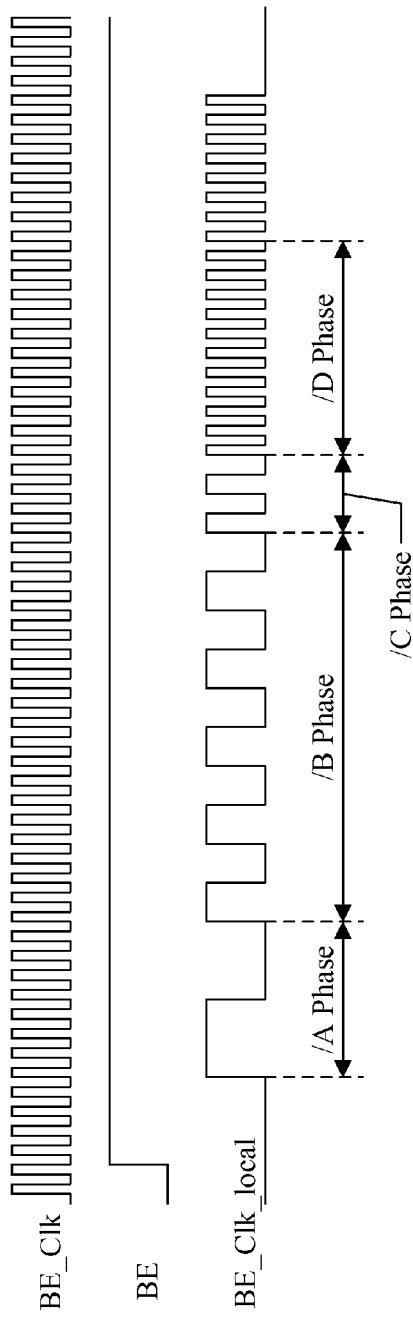
FIG. 6 is a timing diagram illustrating operation of one embodiment of the block enable and block enable clock.

FIG. 6 is a timing diagram illustrating one embodiment of the BE_Clk and the block enable (BE) from the power manager circuit 18 and the BE_Clk_local generated by the clock control circuit 36 for a power up event in the power gated block 14A.

The BE_Clk is illustrated as operating at a given frequency (e.g. the BE_Clk_Freq in the register 17). The BE_Clk may operate only during times that the block enable is changing, in an embodiment. Particularly, the power manager circuit 18 may be configured to begin toggling BE_Clk slightly before changing the block enable, and may continue to just after the block enable has fully shifted through the flops 30A-30E. The BE is asserted (high) in this case to indicate the power up event for the power gated block 14A. In other embodiments, the BE may be asserted low to control the gates of the PMOS transistors in the power switch segments 20A-20E. Alternatively, the buffers in the power switch segments may include an initial inversion to invert the BE to provide an active low signal that activates the PMOS transistors.

In this embodiment, the BE_Clk_local transitions through four phases of clock frequencies during a power up event. More or fewer phases may be implemented in other embodiments. The frequency and length of each phase may be programmable in the clock control circuit 36, in an embodiment. Thus, the frequency and length of each phase may be tuned to control di/dt effects and latency. Additionally, any number of phases less than or equal to the number of supported phases may be used by programming two or more phases to the same frequency and programming the lengths to be a combined amount equal to the desired length, or by programming one or more phases with a length of zero.

In the illustrated embodiment, the frequency is programmed as a clock divisor to be used to divide the frequency of the BE_Clk. Accordingly, the phases are labeled as the /A phase, /B phase, /C phase, and /D phase in FIG. 6. In the example, the /A phase is programmed to divide by 8, for one clock pulse (or cycle). The /B phase is programmed to divide by four for 5 clock pulses. The /C phase is programmed to divide by 2 for 2 clock pulses; and the /D phase is programmed to divide by one for 11 clock pulses. After the /D phase, the BE_Clk_local may toggle at the BE_Clk frequency for some number of pulses and then stop, in the illustrated embodiment.

For the above example divisors and lengths, the latency for the power up may 43 BE_Clk cycles before the phases are completed. Additionally, the phases are monotonically increasing in frequency. With the low frequency of the /A phase, a few power switches may be turned on, limiting the current while the local supply voltage magnitude rises rapidly. The somewhat higher frequencies of the /B and /C phases gradually turn on more power switches, but because the local voltage magnitude is near the global supply voltage magnitude, the current is still relatively low. Finally, the last switches are turned on rapidly as the local supply voltage magnitude nearly reaches the global supply voltage magnitude.

Figure 7:
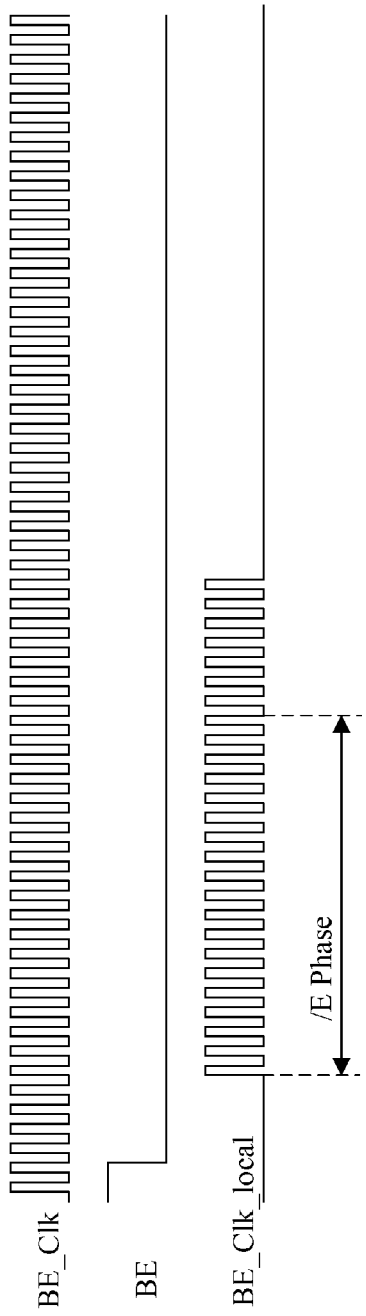
FIG. 7 is a timing diagram illustrating operation of one embodiment of the block enable and block enable clock.

On the other hand, the disabling of power switches for a power down event may not pose di/dt issues. In many cases, the power gated block 14A may be quiescent before it is powered down (otherwise, it would be unlikely to be powered down since it is busy). Accordingly, dynamic current flow may be low. Additionally, the charge on the local supply voltage grid may drain to ground at a leakage rate, again not causing significant current flow. Accordingly, as shown in FIG. 7, the BE_Clk_local may toggle at the BE_Clk frequency for power down events. Alternatively, the /E phase may be programmed to a different divisor if desired. The length of the /E phase may be greater than or equal to the number of flops 30A-30E in the power gated block.

Figure 8:
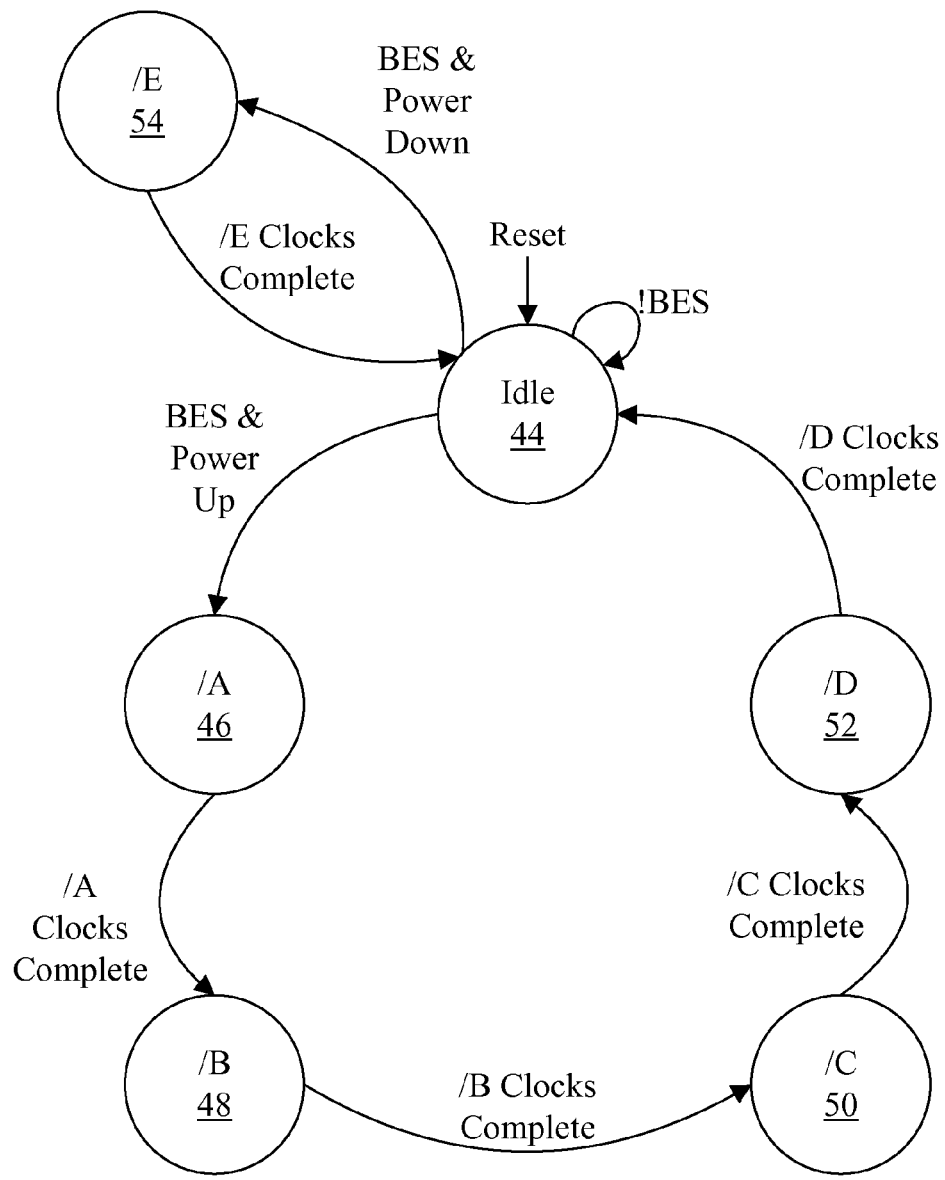
FIG. 8 is a state machine illustrating local block enable clock generation for an embodiment.

FIG. 8 is a state machine illustrating operation of one embodiment of the clock control circuit 36. The state machine includes a state for each of the phases shown in FIGS. 6 and 7 as well as an idle state 44. That is, the state machine includes a /A state 46, a /B state 48, a /C state 50, a /D state 52, and a /E state 54 in addition to the idle state 44. At reset, the state machine may initialize to the idle state 44. If the block enable select is not selecting the outputs of the flops 30A-30E through the muxes 34A-34E (!BES arc in FIG. 8), the state machine may remain in the idle state 44. If the block enable select is selecting the outputs of the flops 30A-30E and the block enable is being asserted (a power up event), the state machine may transition from the idle state 44 to the /A state 46. As the number of clock pulses in each state completes, the state machine may transition from the /A state 46 through the states 48, 50, and 52 and back to idle state 44. In each of the states 46, 48, 50, and 52, the respective clock divisor and length may be used to generate the BE_Clk_local clock (e.g. the A phase divisor and length may be used in the /A state 46; the B phase divisor and length may be used in the /B state 48; etc.). Similarly, if the block enable select is selecting the outputs of the flops 30A-30E and the block enable is being deasserted (a power down event), the state machine may transition from the idle state 44 to the /E state 54 until the length of the /E phase is completed, at which time the state machine may transition back to the idle state 44.

The power switch transistors in a given power switch segment need not all be sized the same. For example, some power switch transistors may be sized small (e.g. small channel widths) which may have lower current capacity than larger transistors (e.g. large channel widths). In one embodiment, the small transistors may be enabled first, generating a lower di/dt while the local power grid is charged, followed by the larger transistors. In an embodiment, the small/large separation of enables may be implemented when the muxes 34A-34E select the propagated block enables. When the flopped enables are selected, the small and large power switch transistors in the same power switch segment may be enabled concurrently. An embodiment is illustrated in FIG. 9 for when the propagated enables are selected.

Figure 9:
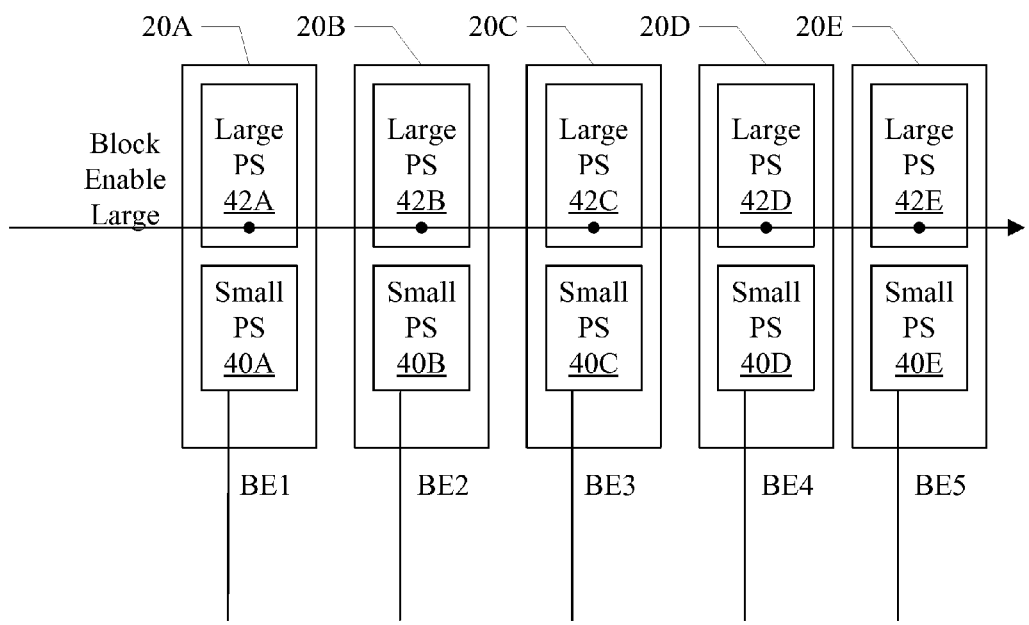
FIG. 9 is block diagram illustrating small and large power switches for a embodiment.

FIG. 9 is a block diagram of an embodiment of the power switch segments 20A-20E when the propagated enables are selected. In this embodiment, the power manager 18 may generate a block enable for the small power switch transistors (the block enable provided to the power control circuit 24) and a block enable for the large power switch transistors (block enable large in FIG. 9). The block enable for the small power switches small may be used to generate the BE1-BE5 local block enables, as previously described. The local block enables are illustrated as coupled to the small power switch transistors 40A-40E in the power switch segments 20A-20E. The large power switch transistors 42A-42E may receive the large block enable directly. There may be buffering including in one or both of the small power switch transistors 40A-40E and the large power switch transistors 42A-42E, as desired, similar to the embodiments previously described. In embodiments in which the outputs of the flops are selected, the large power switch transistors 42A-42E may be enabled at the same time as the corresponding BE1-BE5 is asserted. Viewed in another way, each set of large power switch transistors may receive an output of a mux which selects other the corresponding BE1-BE5 (flops selected) or the block enable large (propagate enables selected).

Figure 10:
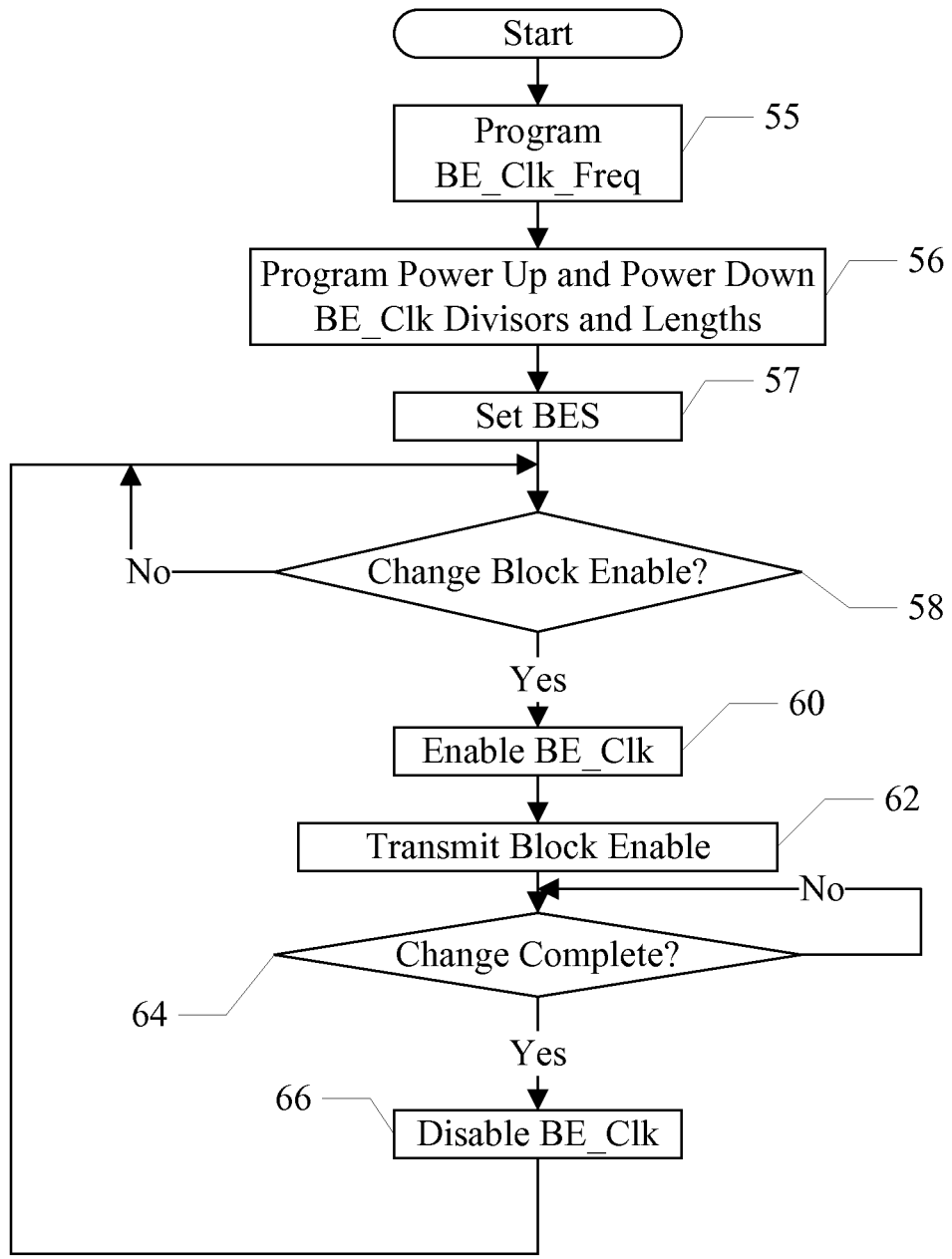
FIG. 10 is a flowchart illustrating operation of one embodiment of the integrated circuit.

Turning next to FIG. 10, a flowchart is shown illustrating operation of one embodiment of the power manager circuit 18 and/or power control code that may be executable on a processor in the integrated circuit 10 or coupled to the integrated circuit 10 to implement the flopped enable mechanism for powering up a power gated block. While the blocks are shown in a particular order for ease of understanding, other orders may be used. Blocks implemented by the power manager circuit 18 may be performed in parallel in combinatorial logic circuits in the power manager circuit 18. Blocks, combinations of blocks, and/or the flowchart as a whole may be pipelined over multiple clock cycles. The power control code may comprise instructions which, when executed by the processor, implement the operation described below.

The power control code may program the BE_Clk_Freq register 17 to select the BE_Clk clock frequency (block 55). Particularly, the selected frequency may be about twice the frequency that may be possible at the fastest PVT conditions, in an embodiment. The selected frequency may be used for any PVT conditions in the integrated circuit 10. Other embodiments may select any other desired frequency based on di/dt limits. In one embodiment, the frequency may be determined by reading fuses blown during manufacture of the integrated circuit or may be provided in some other non-volatile fashion. In other embodiments, the programmability of the frequency may be used for flexibility in the implementation.

The power control code may program the power up and power down BE_Clk divisors and lengths for each phase (e.g. the /A phase, the /B phase, etc. through the /E phase) (block 56). The power control code may also write the BES circuit 32 to set the BES to the muxes 34A-34E, selecting the outputs of the flops 30A-30E (block 57).

If a change in the block enable for a power managed block is to be performed (decision block 58, "yes" leg), the power manager 18 may enable the BE_Clk (block 60). In this embodiment, the BE_Clk may only be enabled (i.e. toggling) during times that the block enable is changing state. During other times, the BE_Clk may be disabled (not toggling). Power may be conserved by not toggling the BE_Clk when not needed. Other embodiments may not enable and disable the BE_Clk. The block enable may change from enabled to disabled or from disabled to enabled to be detected as a change with respect to decision block 58. The power manager 18 may monitor, in hardware, the activity within the integrated circuit 10 and may determine that a block enable is to be changed responsive to the monitoring. Alternatively, the power control code may perform the monitoring and may write a register in the power manager 18 to cause the block enable change.

The power manager 18 may transmit the block enable (block 62). Once the change is completed, such as after enough clock cycles of the BE_Clk to have propagated the block enable and charged the local power grid in the enabled block based on the phases programmed into the clock control circuit 36 (decision block 64, "yes" leg), the power manager 18 may disable the BE_Clk (block 66).

Figure 11:
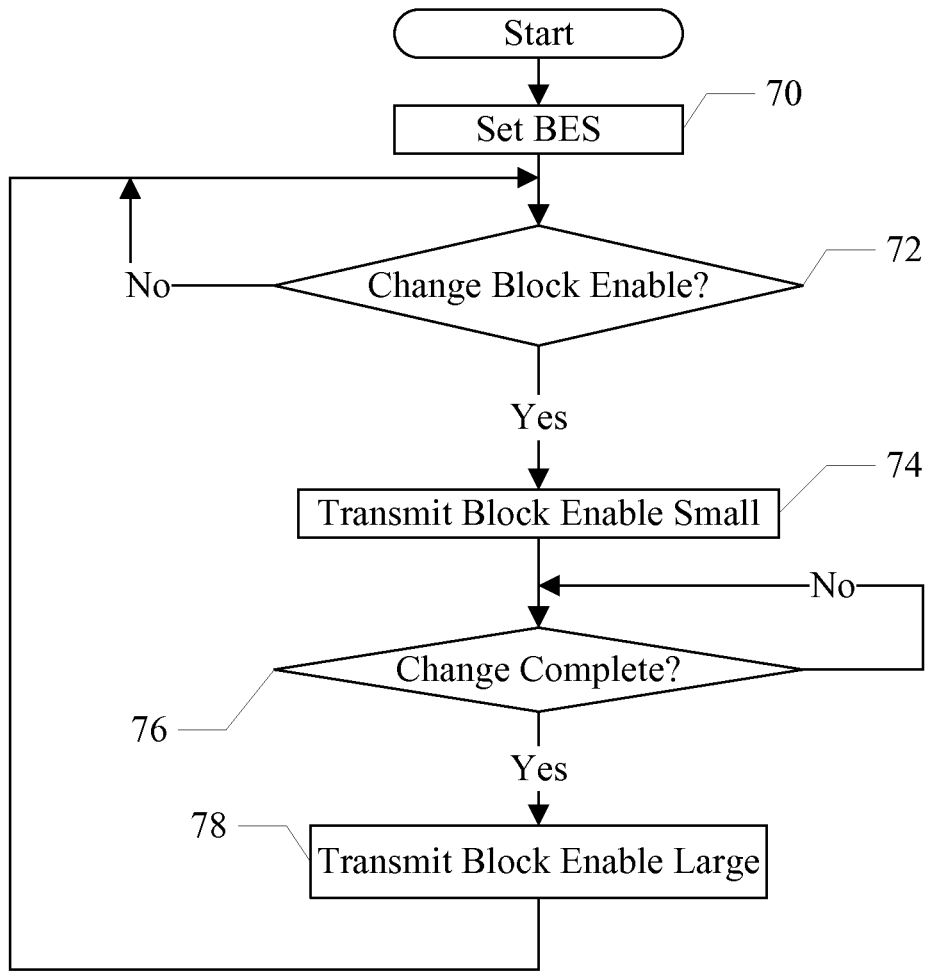
FIG. 11 is a flowchart illustrating operation of another embodiment of the integrated circuit.

FIG. 11 is a flowchart is shown illustrating operation of one embodiment of the power manager circuit 18 and/or power control code that may be executable on a processor in the integrated circuit 10 or coupled to the integrated circuit 10 to implement the propagated enable mechanism for powering up a power gated block. While the blocks are shown in a particular order for ease of understanding, other orders may be used. Blocks implemented by the power manager circuit 18 may be performed in parallel in combinatorial logic circuits in the power manager circuit 18. Blocks, combinations of blocks, and/or the flowchart as a whole may be pipelined over multiple clock cycles. The power control code may comprise instructions which, when executed by the processor, implement the operation described below.

The power control code may write the BES circuit 32 to clear the BES to the muxes 34A-34E, selecting the propagated enables (block 70). If a change in the block enable for a power managed block is to be performed (decision block 72, "yes" leg), the power manager 18 may transmit the block enable small (block 74). Once the change is completed, such as after enough time has passed for the power supply voltage to have ramped close to full voltage magnitude (decision block 76, "yes" leg), the power manager 18 may transmit the block enable larger (block 78).

It is noted that, while the above embodiments illustrated a fixed number of power switches coupled to each local block enable, the number of power switches may be programmable based on the process parameters (e.g. including logic in the propagation of the local block enables to power switches). Additionally, the clock frequency of the BE_Clk may be varied dynamically during power ramping to further control the ramp rate, if desired.

System and Computer Accessible Storage Medium

Figure 12:
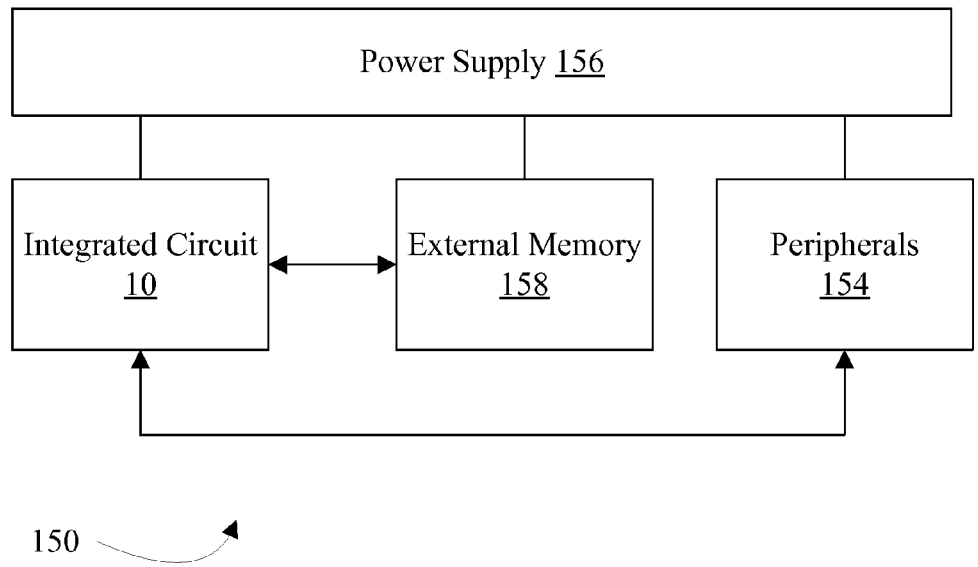
FIG. 12 is a block diagram of one embodiment of a system including the apparatus illustrated in FIG. 1.

Turning next to FIG. 12, a block diagram of one embodiment of a system 150 is shown. In the illustrated embodiment, the system 150 includes at least one instance of an integrated circuit 10 (from FIG. 1) coupled to one or more peripherals 154 and an external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as wifi, Bluetooth, cellular, global positioning system, etc. The peripherals 154 may also include additional storage, including RAM storage, solid state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, net top etc.).

The external memory 158 may include any type of memory. For example, the external memory 158 may be SRAM, dynamic RAM (DRAM) such as synchronous DRAM (SDRAM), double data rate (DDR, DDR2, DDR3, etc.) SDRAM, RAMBUS DRAM, etc. The external memory 158 may include one or more memory modules to which the memory devices are mounted, such as single inline memory modules (SIMMs), dual inline memory modules (DIMMs), etc.

Figure 13:
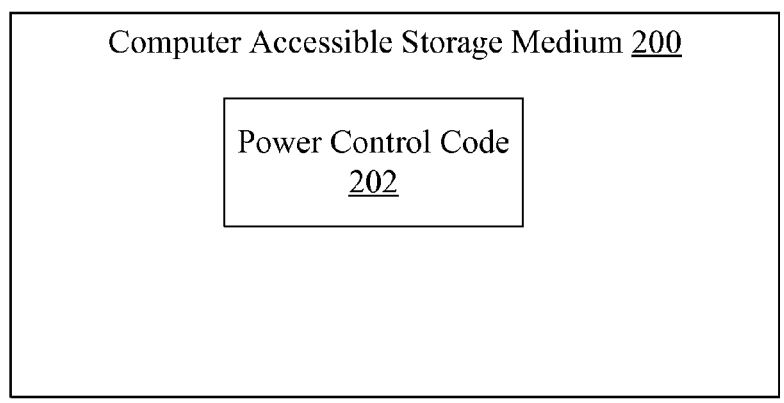
FIG. 13 is a block diagram of one embodiment of a computer accessible storage medium.

Turning now to FIG. 13, a block diagram of a computer accessible storage medium 200 is shown. Generally speaking, a computer accessible storage medium may include any storage media accessible by a computer during use to provide instructions and/or data to the computer. For example, a computer accessible storage medium may include storage media such as magnetic or optical media, e.g., disk (fixed or removable), tape, CD-ROM, DVD-ROM, CD-R, CD-RW, DVD-R, DVD-RW, or Blu-Ray. Storage media may further include volatile or non-volatile memory media such as RAM (e.g. synchronous dynamic RAM (SDRAM), Rambus DRAM (RDRAM), static RAM (SRAM), etc.), ROM, or Flash memory. The storage media may be physically included within the computer to which the storage media provides instructions/data. Alternatively, the storage media may be connected to the computer. For example, the storage media may be connected to the computer over a network or wireless link, such as network attached storage. The storage media may be connected through a peripheral interface such as the Universal Serial Bus (USB). Generally, the computer accessible storage medium 200 may store data in a non-transitory manner, where non-transitory in this context may refer to not transmitting the instructions/data on a signal. For example, non-transitory storage may be volatile (and may lose the stored instructions/data in response to a power down) or non-volatile.

The computer accessible storage medium 200 in FIG. 13 may store power control code 202. The power control code 202 may include instructions which, when executed, implement the operation described above with regard to FIG. 10 and/or FIG. 11. Generally, the computer accessible storage medium 200 may store any set of instructions which, when executed, implement a portion or all of the operation shown in FIG. 10 and/or FIG. 11. A carrier medium may include computer accessible storage media as well as transmission media such as wired or wireless transmission.

Numerous variations and modifications will become apparent to those skilled in the art once the above disclosure is fully appreciated. It is intended that the following claims be interpreted to embrace all such variations and modifications.

What is claimed is:

1. A power control apparatus comprising:
   a plurality of power switch segments each comprising a plurality of power switches, wherein:
      the power switches are coupled to a first power rail that is powered to a power supply voltage during use;
      the power switches are coupled to one or more power supply inputs of a block of circuits; and
      the power switches in a given power switch segment logically share a power switch enable input to the given power switch segment;
   a plurality of flops coupled in series, wherein a first flop in the series is coupled to a global power switch enable input;
   a plurality of multiplexors, wherein:
      each multiplexor includes a first input coupled to an output of a given flop of the plurality of flops and a second input coupled to a power switch enable output of one of the plurality of power switch segments; and
      each multiplexor has an output coupled to the power switch enable input of a respective power switch segment of the plurality of power switch segments; and
   clock circuitry configured to:
      generate a clock for the plurality of flops; and
      during a power up cycle of the block and during a time period that the one or more power supply inputs are charging to a voltage supplied from the first power rail, sequence a clock frequency at which the clock toggles through a preselected plurality of frequencies, each frequency of the plurality of frequencies used for a preselected number of clock pulses at that frequency.

2. The power control apparatus as recited in claim 1 wherein at least two multiplexors of the plurality of multiplexors have the first input coupled to the output of the given flop.

3. The power control apparatus as recited in claim 1 wherein the multiplexors include a select input that selects either the first input or the second input as the output, and the power control apparatus further comprises circuitry configured to generate the select input.

4. The power control apparatus as recited in claim 3 wherein the circuitry is configured to select the second input in response to reset of the apparatus.

5. The power control apparatus as recited in claim 4 wherein the circuitry is programmable to select the first input subsequent to reset.

6. The power control apparatus as recited in claim 1 wherein the clock frequency is initially at a first frequency of the plurality of frequencies and increases to one or more additional frequencies of the plurality of frequencies during the power up cycle.

7. The power control apparatus as recited in claim 1 wherein the plurality of flops are powered from the first power rail directly.

8. An integrated circuit comprising:
- a plurality of power switches coupled to a supply voltage node and configured to provide supply voltage to a circuit block responsive to a plurality of enables, wherein each of the plurality of power switches is coupled to one of the plurality of enables;
- a power control circuit configured to generate the plurality of enables for the plurality of power switches responsive to an input block enable, wherein the power control circuit comprises:
  - a plurality of series-connected clocked storage devices, wherein a first clocked storage device is coupled to receive the input block enable; and
  - a plurality of multiplexors, each of the plurality of multiplexors coupled to an output of one of the plurality of series-connected clocked storage devices and coupled to a block enable propagated through a respective subset of the plurality of power switches, wherein an output of each of the plurality of multiplexors is one of the plurality of enables; and
- clock circuitry configured to generate a clock for the plurality of flops, and, during a power up cycle of the block and during a time period that the one or more power supply inputs are charging to a voltage supplied from the first power rail, the clock circuitry is configured to modify a clock frequency at which the clock toggles through a series of predetermined frequencies in a predetermined pattern.

9. The integrated circuit as recited in claim 8 wherein each of the plurality of multiplexors includes a multiplexor select input, and wherein the multiplexor select input defaults to selecting the block enable propagated through the respective subset, whereby the plurality of power switches are logically daisy-chained to receive the enable.

10. The integrated circuit as recited in claim 9 wherein each of the plurality of block enables are passed through a plurality of series-connected buffers to enable the respective subset, wherein the block enable propagated through the respective subset is an output of the plurality of series-connected buffers.

11. The integrated circuit as recited in claim 8 wherein the frequency is initially at a first frequency and increases to one or more additional frequencies during the power up cycle.

12. The integrated circuit as recited in claim 11 wherein the clock circuitry is configured to divide an input clock by a first programmable divisor to generate the clock at the first frequency, then divide the input by a second programmable divisor to generate a second frequency that is one of the one or more additional frequencies.

13. The integrated circuit as recited in claim 8 wherein the plurality of flops are powered from the supply voltage node directly.

14. The integrated circuit as recited in claim 8 wherein the plurality of flops are located outside of the circuit block, in a second circuit block that is powered by the supply voltage node.

15. The integrated circuit as recited in claim 14 wherein the second circuit block remains powered when the circuit block is powered down.

16. A method comprising:
- determining that a power gated block in an integrated circuit is to be powered up;
- asserting a block enable and enabling an enable clock to the power gated block responsive to the determining;
- propagating the block enable through a plurality of series-connected clocked storage devices, generating a plurality of propagated block enables;
- activating a plurality of power switch segments in the power gated block, wherein each of the plurality of power switch segments are coupled to receive an enable from one of a plurality of multiplexors, and each of the plurality of multiplexors selects between one of the plurality of propagated block enables and a second enable that is output from another one of the plurality of power switch segments, and the second enable is a delayed version of the enable received by the other one of the plurality of power switch segments; and
- varying a frequency of a clock to the plurality of series-connected clocked storage devices during the propagating and during a time period that one or more power supply inputs to the power gated block are charging to a voltage supplied from the first power rail, wherein the varying is performed in a plurality of phases, each phase have a preselected frequency at which the clock operates for a predetermined duration.

17. The method as recited in claim 16 wherein the varying comprising monotonically increasing the frequency.

18. The power control apparatus as recited in claim 1 wherein the clock circuitry is configured to sequence the clock frequency in a monotonically increasing pattern.

19. The integrated circuit as recited in claim 8 wherein the clock circuitry is configured to modify the clock frequency in a monotonically increasing pattern.

* * * * *